(12) United States Patent
Takahashi et al.

(10) Patent No.: US 10,714,154 B2
(45) Date of Patent: Jul. 14, 2020

(54) SEMICONDUCTOR INTEGRATED CIRCUIT DEVICE AND SEMICONDUCTOR DEVICE

(71) Applicant: RENESAS ELECTRONICS CORPORATION, Tokyo (JP)

(72) Inventors: Hiroyuki Takahashi, Tokyo (JP); Muneaki Matsushige, Tokyo (JP)

(73) Assignee: RENESAS ELELCTRONICS CORPORATION, Tokyo (JP)

(*) Notice: Subject to any disclaimer, the term of this patent is extended or adjusted under 35 U.S.C. 154(b) by 0 days.

(21) Appl. No.: 16/794,907

(22) Filed: Feb. 19, 2020

(65) Prior Publication Data

US 2020/0185012 A1 Jun. 11, 2020

Related U.S. Application Data

(62) Division of application No. 15/914,822, filed on Mar. 7, 2018, now Pat. No. 10,607,663.

(30) Foreign Application Priority Data

May 24, 2017 (JP) .................. 2017-103136

(51) Int. Cl.
| | |
|---|---|
| *G11C 5/14* | (2006.01) |
| *G11C 7/06* | (2006.01) |
| *H01L 27/108* | (2006.01) |
| *G11C 11/409* | (2006.01) |
| *G11C 7/08* | (2006.01) |

(Continued)

(52) U.S. Cl.
CPC .............. *G11C 7/06* (2013.01); *G11C 5/147* (2013.01); *G11C 7/065* (2013.01); *G11C 7/08* (2013.01); *G11C 11/409* (2013.01); *G11C 11/4074* (2013.01); *G11C 11/4091* (2013.01); *H01L 27/108* (2013.01)

(58) Field of Classification Search
CPC ..................................... G11C 5/147
USPC ........................................ 365/226
See application file for complete search history.

(56) References Cited

U.S. PATENT DOCUMENTS

| | | | |
|---|---|---|---|
| 6,101,140 A | 8/2000 | Tsukada | |
| 7,876,637 B2 * | 1/2011 | Hirobe | G11C 5/147 365/205 |

FOREIGN PATENT DOCUMENTS

| | | |
|---|---|---|
| JP | 60-48525 A | 3/1985 |
| JP | 2000-057773 A | 2/2000 |

OTHER PUBLICATIONS

U.S. PTO Non-Final Office Action issued in related parent U.S. Appl. No. 15/914,822, dated Aug. 5, 2019.

(Continued)

*Primary Examiner* — Jason Lappas
(74) *Attorney, Agent, or Firm* — McDermott Will & Emery LLP

(57) ABSTRACT

Even when a driven circuit has a large-scale load, a small-scale step-down driver circuit can supply an internal potential to the driven circuit at high speed. A semiconductor integrated circuit device includes a step-down driver circuit which supplies, to a driven circuit to be driven by an internal potential lower than an external potential supplied from an external power supply, the internal potential. The step-down driver circuit includes an NMOS transistor having a drain coupled to an external power supply terminal to be coupled to the external power supply and a source to be coupled to a voltage supply point of the driven circuit and a driver circuit to drive the gate of the NMOS transistor.

8 Claims, 12 Drawing Sheets

(51) Int. Cl.
    *G11C 11/4091*     (2006.01)
    *G11C 11/4074*     (2006.01)

(56) References Cited

OTHER PUBLICATIONS

U.S. PTO Notice of Allowance issued in related parent U.S. Appl. No. 15/914,822, dated Nov. 25, 2019.
Related parent U.S. Appl. No. 15/914,822, filed Mar. 7, 2018.

* cited by examiner

——— WAVEFORM AT VOLTAGE SUPPLY POINT 20
(FIRST EMBODIMENT)
-------- WAVEFORM OF VG
—·—·— WAVEFORM AT VOLTAGE SUPPLY POINT 20
(EXAMPLE FOR COMPARISON)

——— WAVEFORM AT VOLTAGE SUPPLY POINT 20
------- WAVEFORMS OF VG1 AND VG2

ND SEMICONDUCTOR DEVICE

SEMICONDUCTOR INTEGRATED CIRCUIT DEVICE AND SEMICONDUCTOR DEVICE

CROSS-REFERENCE TO RELATED APPLICATIONS

This is a Divisional of U.S. patent application Ser. No. 14/914,822 filed on Mar. 7, 2018, which claims the benefit of Japanese Patent Application No. 2017-103136 filed on May 24, 2017 including the specification, drawings and abstract are incorporated herein by reference in their entirety.

BACKGROUND

The present invention relates to semiconductor devices and more particularly to semiconductor integrated circuit devices including a step-down driver circuit for supplying a stepped-down potential to a driven circuit with a large load.

Generally, a driven circuit which uses an internal potential lower than an external power supply is configured to have power supplied from an internal step-down power supply circuit which generates a constant voltage based on a reference potential. The driven circuit is, when being active, supplied with an internal potential and is, when being inactive, kept reset to GND potential (reference potential). Generally, a PMOS transistor, which is a switch element, is provided between the internal step-down power supply circuit and the driven circuit to be supplied with power. Power supply to the driven circuit is controlled by controlling turning on/off of the switch element.

Driven circuits to use an internal potential include, for example, driven circuits with large-scale loads such as sense amplifier driver circuits. According to Japanese Unexamined Patent Application No. 2000-57773, to reduce power routing of a step-down power supply so as to reduce circuit area requirement, a sense amplifier driver circuit to drive a large-load sense amplifier power supply line is provided for each array. The sense amplifier driver circuit includes a PMOS transistor having a switching function and a step-down function and supplies a stepped-down potential generated by stepping down an external voltage supplied from an external power supply using the PMOS transistor to a sense amplifier power supply line. In concrete terms, the stepped-down potential is generated by having the gate potential of the PMOS transistor controlled by a step-down circuit (differential amplifier circuit).

SUMMARY

In cases where an internal step-down power supply circuit is provided to supply an internal potential to a driven circuit and the driven circuit has a large-scale load, the following problems are caused. First, the internal step-down power supply circuit requiring a large current supply capacity increases in area. Also, since it is necessary to supply a large drive current via a switch element provided between the internal step-down power supply circuit and the driven circuit, the switch element is required to have a large capacity and, as a result, becomes large. When the switch element becomes larger, the load of driving the gate of the element also increases to result in a lower switching speed or a larger driving power requirement.

Furthermore, when the switch element is turned on, a large current instantaneously flows and a transient power supply noise is generated in the step-down power supply (internal power supply). Suppressing the power supply noise requires a large stabilization capacity to be coupled and this leads to an area (cost) increase. Generally, the internal step-down power supply circuit also supplies an internal power supply to other logic circuits and analog circuits. When, in a circuit as described above, power supply noise is propagated through power supply lines, circuit characteristics may vary and operating margin errors may occur. This problem may be avoided by dividing the internal step-down power supply circuit, but as the number of internal step-down power supply circuits increases, an area (cost) increase will result.

In the sense amplifier driver circuit according to Japanese Unexamined Patent Application No. 2000-57773 on the other hand, many PMOS transistors are made to perform both a switching function and a stepping-down function. Therefore, when the external power supply voltage lowers and the capacity of the step-down circuit (differential amplifier circuit) to control the gate voltages of the PMOS transistors decreases, necessity to make the step-down circuit larger increases so as to secure a required driving capacity. This results in an area increase. Also, though it is necessary to turn on/off the step-down circuit in coordination with active operation of a selected block, the step-down circuit (differential amplifier circuit) being an analog circuit may not be able to operate quickly enough.

Other objects and novel features of the present invention will become apparent from the following specification and accompanying drawings. Japanese Unexamined Patent Application No. Sho 60 (1985)-48525 describes a related-art technique in which a MOS-FET having a drain coupled to a power supply unit supplies power to a circuit. The technique according to this patent literature is aimed at reducing the power consumption when the circuit is in a standby-state and the patent literature contains no description as to providing an internal power supply different from an external power supply.

According to an embodiment of the present invention, a semiconductor integrated circuit device includes a step-down driver circuit which supplies, to a driven circuit to be driven by an internal potential lower than an external potential supplied from an external power supply, the internal potential. The step-down driver circuit includes an NMOS transistor having a drain coupled to an external power supply terminal to be coupled to the external power supply and a source to be coupled to a voltage supply point of the driven circuit and a driver circuit to drive the gate of the NMOS transistor.

According to the above embodiment, even when a driven circuit has a large-scale load, a small-scale step-down driver circuit can supply an internal potential to the driven circuit at high speed.

DETAILED DESCRIPTION

Embodiments of the present invention will be described below based on the attached drawings.

First Embodiment

Figure 1:
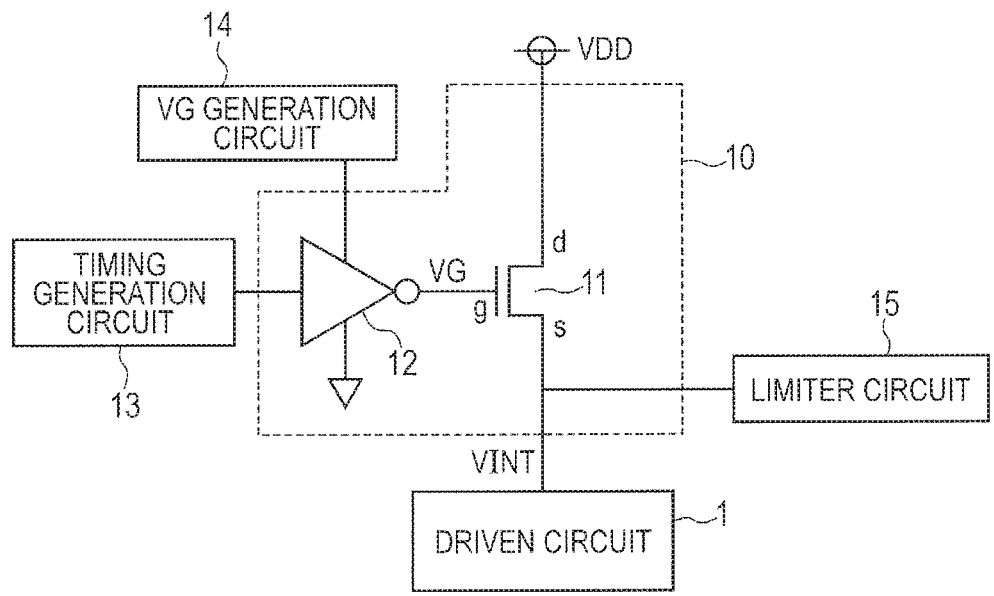
FIG. 1 shows a concept of a step-down driver circuit.

FIG. 1 illustrates the concept of a step-down driver circuit of a first embodiment of the present invention. The step-down driver circuit 10 generates a target internal potential VINT from an external potential VDD supplied from an external power supply and supplies the internal potential VINT to a driven circuit 1. The step-down driver circuit 10 includes an NMOS transistor 11 having a drain terminal coupled to an external power supply terminal which is coupled to the external potential VDD, a gate terminal coupled to a driver circuit (a logic circuit, for example, an inverter) and a source terminal coupled to a voltage supply point of the driven circuit 1.

In the step-down driver circuit 10 of the present embodiment, the NMOS transistor 11 generates the internal potential VINT and also serves as a voltage supply switch for the driven circuit 1, thereby practically allowing the driven circuit 1 to be supplied with power not from an internal step-down power supply circuit but from an external large-capacity power supply. This allows the driven circuit 1, even if it is a large-load circuit, to be supplied with power while minimizing effects, for example, power supply noise on other circuits.

Furthermore, as being described in detail later, the circuit can be controlled as described below, for example, to enhance the accuracy of supplying the target potential VINT to a voltage supply point or to speed up power supply operation. Such circuit controls can be applied either individually or in combination depending on the accuracy requirement of power supply to the driven circuit 1.

Firstly, a timing generation circuit 13 for controlling the on time of the NMOS transistor 11 controls the on/off state of the NMOS transistor 11 via the driver circuit 12.

Secondly, a gate voltage (VG) generation circuit 14 controls a gate voltage VG to be applied to the gate of the NMOS transistor 11. The VG generation circuit 14 supplies the voltage VG as a power supply on the high potential side of the driver circuit 12.

Thirdly, a limiter circuit 15 coupled to the voltage supply point inhibits the voltage supplied to the driven circuit 1 from rising over the target voltage VINT.

Timing Generation Circuit 13 and Gate Voltage (VG) Generation Circuit 14

Figure 2:
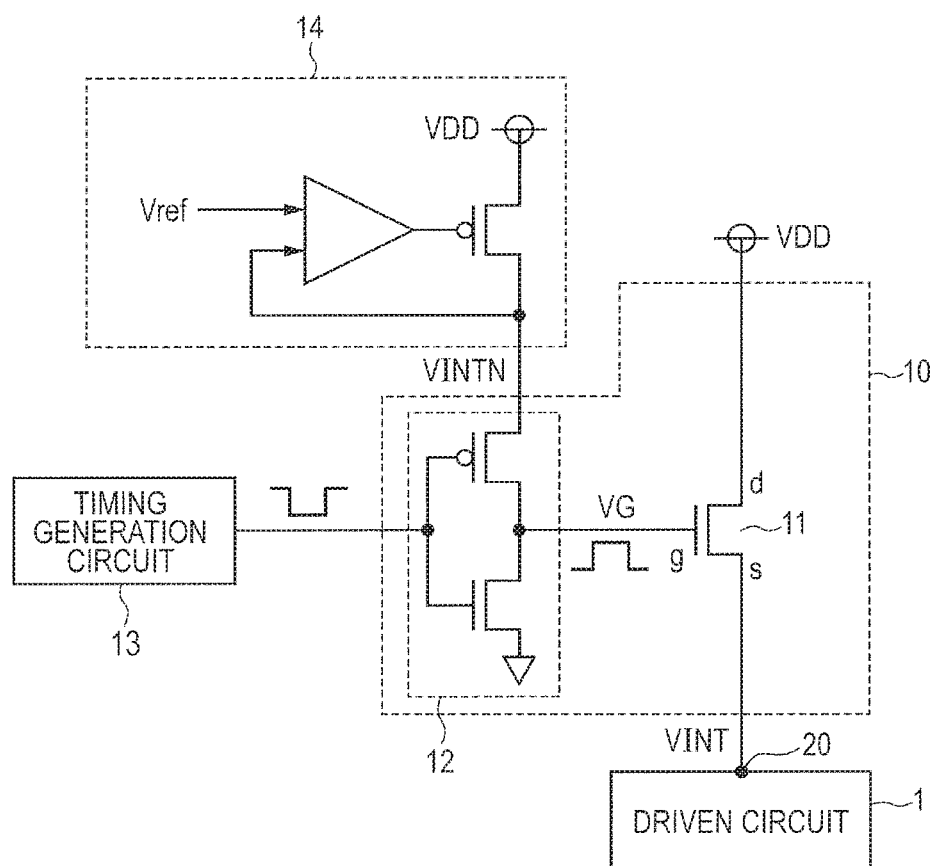
FIG. 2 shows an example of a step-down driver circuit for on-time control.

An example of on time control performed for the NMOS transistor 11 by the timing generation circuit 13 will be described. FIG. 2 shows an example circuit configuration. The VG generation circuit 14 outputs a potential VINTN. The VG generation circuit 14 is configured as a differential amplifier and a reference voltage Vref is set to be higher than the internal potential VINT by a threshold (Vth1) for the NMOS transistor 11, i.e. Vref=VINT+Vth1 in the present case. Note that when Vref is set to be higher, the source potential of the NMOS transistor 11 included in the step-down driver circuit 10 also becomes higher. When the voltage to be supplied to the driven circuit 1 is higher than the internal potential VINT, the reference voltage Vref is to be set higher. The driver circuit 12 is configured as an inverter and includes a PMOS transistor which uses the output potential VINTN of the VG generation circuit 14 as a source. The output of the driver circuit 12 is coupled to the gate of the NMOS transistor 11 that generates the required internal potential VINT while also serving as a supply switch for the driven circuit 1. The on/off state of the gate of the NMOS transistor 11 is controlled by the timing generation circuit 13.

Figure 3:
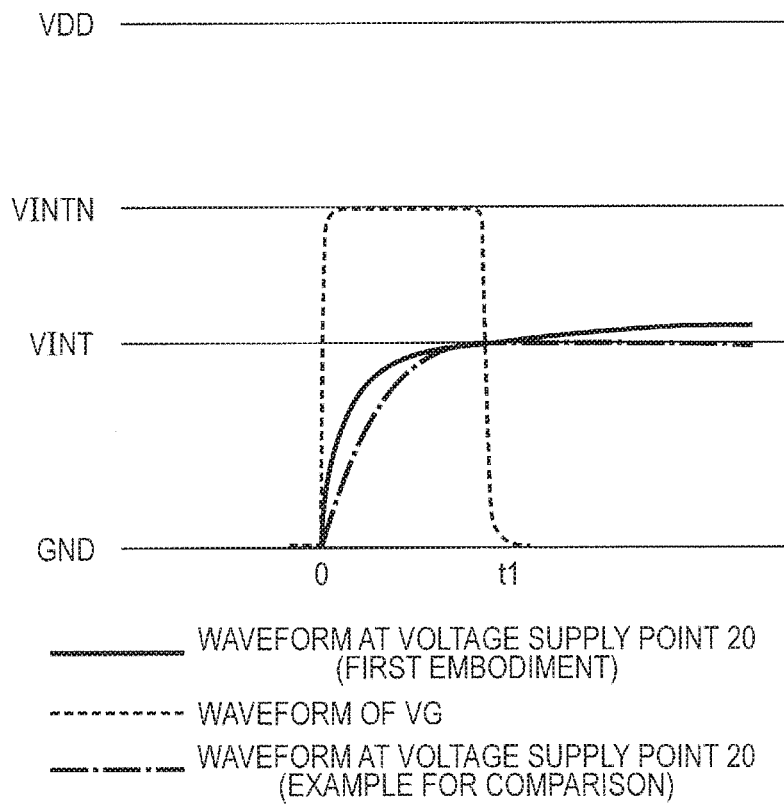
FIG. 3 shows operation waveforms of the circuit shown in FIG. 2.

FIG. 3 shows operation waveforms of the circuit shown in FIG. 2 along with an example waveform for comparison. The example waveform is based on an assumed configuration in which the internal potential VINT to be supplied to the driven circuit 1 is generated in an internal step-down power supply circuit and in which a PMOS transistor is used as a supply switch for the driven circuit 1. In FIG. 3, the example waveform at the voltage supply point 20 is represented by a chain line. When the PMOS transistor turns on, the voltage at the voltage supply point 20 rises to reach the internal potential VINT in a certain period of time.

In the circuit shown in FIG. 2, when the gate voltage VG of the NMOS transistor 11 is GND (reference potential), the NMOS transistor 11 is in an off state (not conducting), but when the output of the driver circuit 12 rises causing the gate voltage VG to reach VINTN (see the broken line in FIG. 3), the NMOS transistor 11 enters an on state (conducting) and the voltage at the voltage supply point 20 starts rising. The driver circuit has a characteristic in which, when the gate voltage VG is maintained at VINTN causing the voltage at the voltage supply point to rise and approach the target potential VINT, the gate-to-source voltage of the NMOS transistor 11 approaches the threshold Vth1 and the conducting performance of the NMOS transistor 11 weakens causing the voltage rise to sharply slow down. This brings the supply voltage toward saturation, but without the voltage rise completely stopping, the voltage continues slightly rising (see the solid line in FIG. 3).

Therefore, to enhance the accuracy of the potential supplied to the driven circuit 1, in the circuit shown in FIG. 2, the timing of turning off of the NMOS transistor 11 is controlled. The timing generation circuit 13 can adjust the target potential VINT by, when time t1 passes after having the output VG of the driver circuit 12 reach VINTN and putting the NMOS transistor 11 into an on state, bringing the output VG of the driver circuit 12 down to GND (reference potential) and putting the NMOS transistor 11 into an off state. The timing generation circuit 13 can be formed with a delay circuit which delays an enable signal for activating the driven circuit 1 by time t1. Alternatively, a disable signal may be generated when a predetermined number of clocks pass after receipt of an enable signal and then timing of turning the NMOS transistor 11 off may be controlled using the disable signal and the enable signal. The VG generation circuit 14 is desirably capable of adjustment to maintain optimum voltage generation regardless of production process variation, temperature variation and external voltage variation. When this is realized, the output of VINTN is stabilized and the accuracy of the potential supplied to the driven circuit 1 can be enhanced.

As shown by the operation waveforms shown in FIG. 3, the NMOS transistor 11 shown in FIG. 2 exceeds in driving performance the example PMOS transistor for comparison. This is for the following reasons. The NMOS transistor is higher in mobility than the PMOS transistor. Also, immediately after the switch transistor used as a supply switch turns on, whereas, in the example for comparison, drain voltage Vds=VINT, in the circuit configuration shown in FIG. 2, drain voltage Vds=VDD realizing a higher potential difference than in the example for comparison. Furthermore, whereas, in the example for comparison, the gate voltage Vgs=VINT, in the circuit configuration shown in FIG. 2, the gate voltage Vgs=VINTN=VINT+Vth1, that is, the on state of the switch transistor is enhanced. Hence, the NMOS transistor 11 shown in FIG. 2 can achieve higher driving performance, so that the driven circuit can be supplied with power at higher speed. Or, it is possible to reduce the size of the NMOS transistor 11 or the area of the control circuit including the driver circuit 12.

Moreover, in cases where the driven circuit 1 has a large-scale load, the current for providing the internal potential VINT is supplied directly from the external power supply VDD that is powerful with respect to the drain of the switch transistor, so that noise of the power supply line is reduced. Furthermore, in cases where there are plural circuits to use the internal potential VINT, driven circuits of large-scale loads may use the step-down driver circuit of the present embodiment whereas the internal step-down power supply circuit to generate the internal potential VINT is used to supply voltage to driven circuits of low loads. In this way, high-load driven circuits and low-load driven circuits can use separate current paths, so that noise propagation problems do not easily develop (see the configuration shown in FIG. 6).

Also, the VG generation circuit 14 that is a step-down circuit including a differential amplifier circuit is to drive only the driver circuit 12 that is a logic circuit, so that the drive load is small. Hence, the VG generation circuit 14 can be realized as a small-area, small-power circuit. Though, in the example shown in FIG. 2, the driver circuit 12 has an inverter configuration, a logic circuit of an AND configuration, a NAND configuration or a NOR configuration may also be employed depending on the control to be performed.

Figure 4:
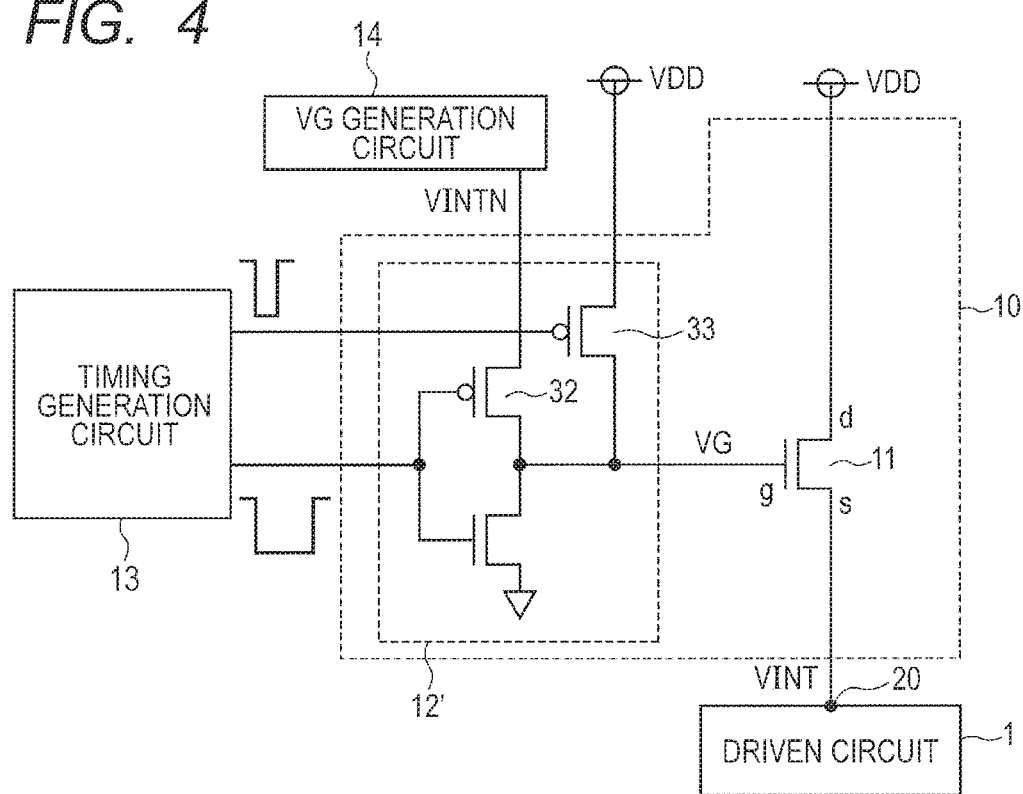
FIG. 4 shows an example of a modified driver circuit.

FIG. 4 shows a driver circuit 12' as an example of a modified driver circuit. The driver circuit 12' can switch-control the gate voltage VG of the NMOS transistor 11. The driver circuit 12' to control the gate voltage VG includes two PMOS transistors 32 and 33. The source terminal of the PMOS transistor 32 is coupled to the stepped-down potential VINTN supplied from the VG generation circuit 14. The source terminal of the PMOS transistor 33 is coupled to an external power supply terminal coupled to the external voltage VDD.

Figure 5:
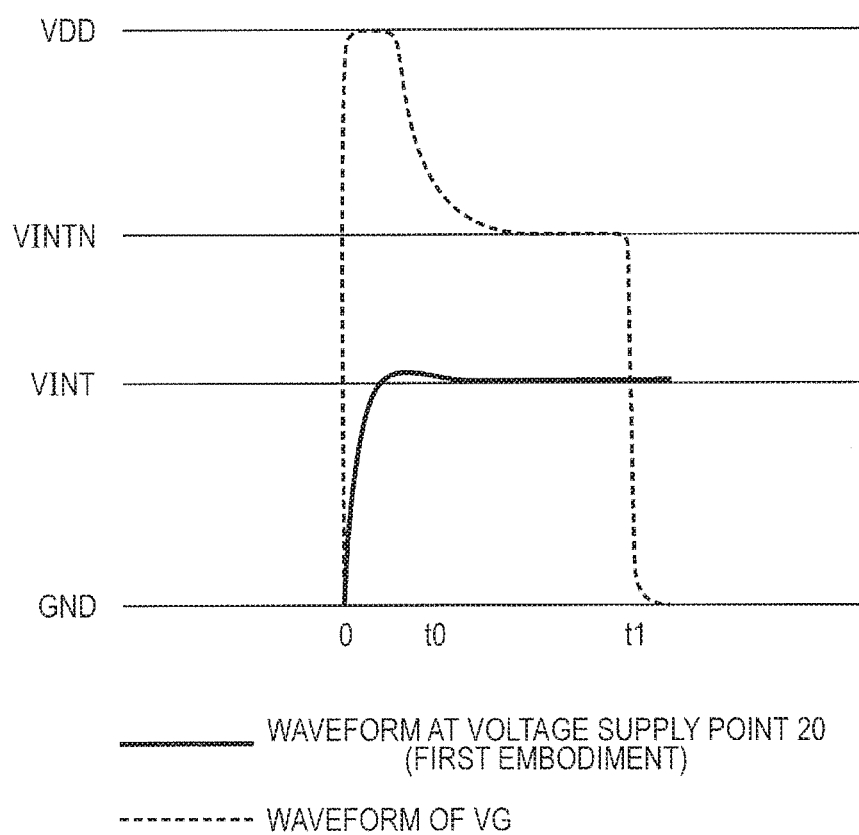
FIG. 5 shows operation waveforms of the circuit shown in FIG. 4.

FIG. 5 shows operation waveforms of the circuit shown in FIG. 4. First, the external potential VDD is applied to the gate voltage VG of the NMOS transistor 11. As a result, at the NMOS transistor 11, the gate voltage Vgs=VDD, thereby, further enhancing the on state of the switch transistor relative to the circuit shown in FIG. 2 and realizing higher driving performance. Note that the external voltage VDD is applied only during an initial short time period t0 and that, after passage of time t0, the PMOS transistor included in the driver circuit 12' is put in an off state, thereby, causing the gate voltage VG to subsequently drop to the stepped-down potential VINTN (period from t0 to t1). Furthermore, after passage of time t1, the NMOS transistor 11 is put in an off state so as to inhibit the potential of the voltage supply point 20 from rising beyond the target potential VINT. In cases where, like in the above example, a high voltage like the external potential VDD is set as the gate potential VG, it is necessary to take into consideration the voltage resistance of the NMOS transistor 11. To apply a high gate voltage VG to the NMOS transistor 11, a MOS transistor with a high voltage resistance may be used as the NMOS transistor 11.

In the circuit configuration shown in FIG. 4, enhancing the driving performance of the NMOS transistor 11 by temporarily increasing the gate voltage Vgs makes it possible to supply a potential to the driven circuit 1 at a higher speed. Or, alternatively, the size of the NMOS transistor 11 may be reduced. In the example shown in FIG. 4, the external voltage VDD is temporarily applied to the gate voltage Vgs of the NMOS transistor 11, but a higher voltage than the voltage VDD may be applied as long as the potential is supplied from an external power supply.

Figure 6:
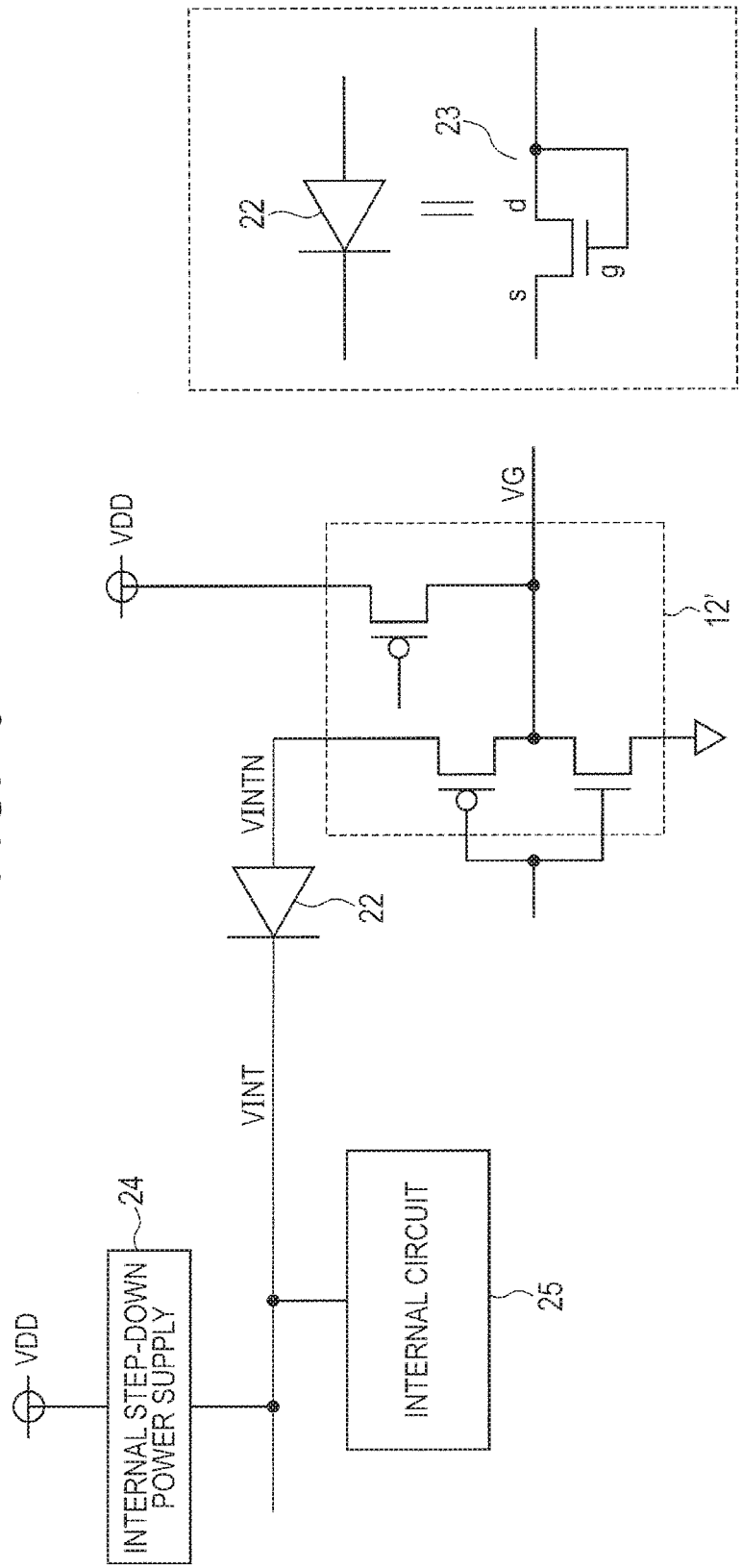
FIG. 6 shows an example of a modified gate voltage (VG) generation circuit.

FIG. 6 shows (centering on modified portions) an example of modification of the circuit configuration shown in FIG. 4. The modification example includes a diode element 22 replacing the VG generation circuit 14 shown in FIG. 6. This modification is effective in cases where an internal step-down power supply circuit 24 to generate the internal potential VINT is separately provided. The internal step-down power supply circuit 24 steps down the external power supply VDD and supplies the internal potential VINT to a low-load internal circuit 25. Also, the internal step-down power supply circuit 24 is capable of adjustment to maintain optimum voltage generation regardless of production process variation, temperature variation and external voltage variation so as to stably supply the internal potential VINT. The internal circuit 25 is, for example, a logic circuit or an analog circuit. Also, the internal step-down power supply circuit 24 can supply the internal potential VINT to plural internal circuits. After the gate voltage VG of the NMOS transistor 11 is charged up to the external potential VDD (up to time t0), the gate voltage VG is discharged to a potential point having the internal potential VINT via a diode element 22 (period from t0 to t1). This causes a voltage equaling the sum of the stepped-down potential VINT and the forward voltage Vf of the diode element 22 to appear on the anode side of the diode element 22. The forward voltage Vf is to be made approximately equal the threshold Vth1 of the NMOS transistor 11.

Or, the diode element 22 may be replaced by a MOS transistor 23 mounted in a diode connection. The MOS transistor 23 may be an element identical with the NMOS transistor 11. Thus, using a diode element (or a MOS transistor in a diode connection) makes it unnecessary to mount a step-down circuit for generating the stepped-down potential VINTN.

An alternative modification example is also possible in which the voltage at the voltage supply point 20 is monitored and the output voltage of the VG generation circuit 14 is feedback-adjusted so as to obtain the target stepped-down potential VINT. Such modification can be realized, for example, by adding a circuit to feedback-adjust the reference voltage Vref for the VG generation circuit 14 shown in FIG. 2. Since the feedback control path includes an analog determination circuit which compares the voltage at the voltage supply point 20 with the target potential VINT used as a reference, quick circuit activation is difficult, but the modification is practicable by utilizing time t0 used as a period for VG driving with the initial external potential VDD for circuit activation.

Limiter Circuit

Figure 7:
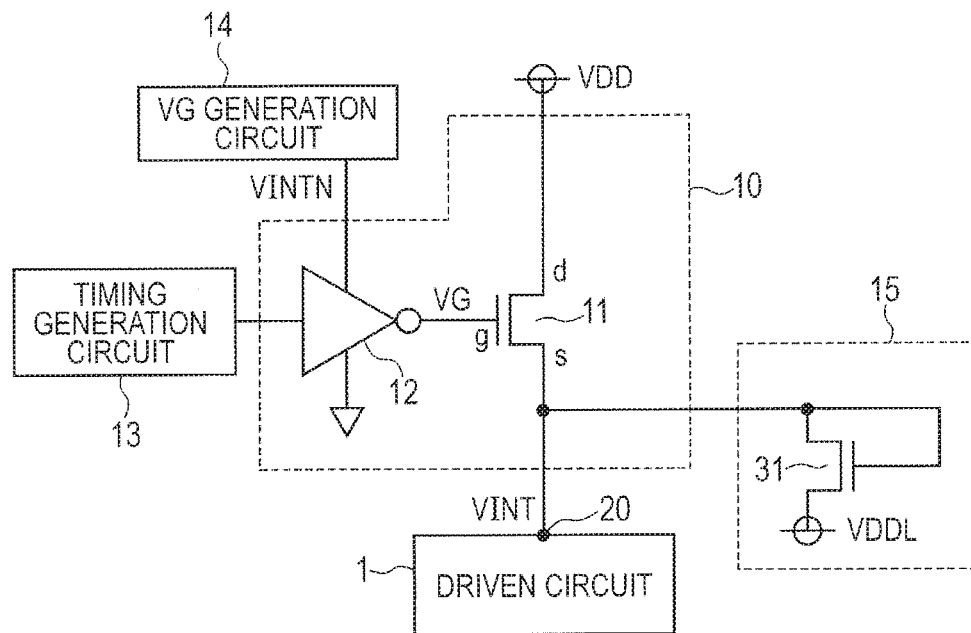
FIG. 7 shows an example of a step-down driver circuit including a limiter circuit.
Figure 8:
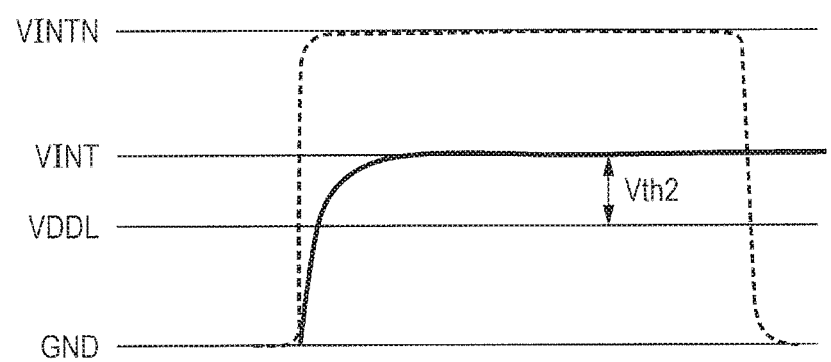
FIG. 8 shows operation waveforms of the circuit shown in FIG. 7.

An example case in which control is performed using a limiter circuit to stably maintain the target potential VINT after being reached at the voltage supply point 20 and prevent the voltage at the voltage supply point 20 from rising will be described below. The circuit configuration shown in FIG. 7 includes an NMOS transistor 31 used as a limiter circuit 15 whose gate and drain are coupled to the voltage supply point 20 and whose source is diode-coupled to a constant voltage power supply VDDL. FIG. 8 shows operation waveforms. When the NMOS transistor 11 is turned on, the internal stepped-down potential is supplied. The potential of the constant-voltage power supply VDDL is set to be the potential VINT less a threshold Vth2 of the NMOS transistor 31 so as to cause the limiter circuit 15 to turn on when the target potential VINT is reached. This makes it possible to accurately maintain the potential at the voltage supply point 20 without controlling the on time of the NMOS transistor 11. The limiter circuit 15 may be an alternative element having a diode characteristic, for example, a PMOS transistor, a bipolar transistor or a PN junction. Still alternatively, a circuit to make a small leak current flow may be used to remove excessive charges at the voltage supply point 20.

Figure 19:
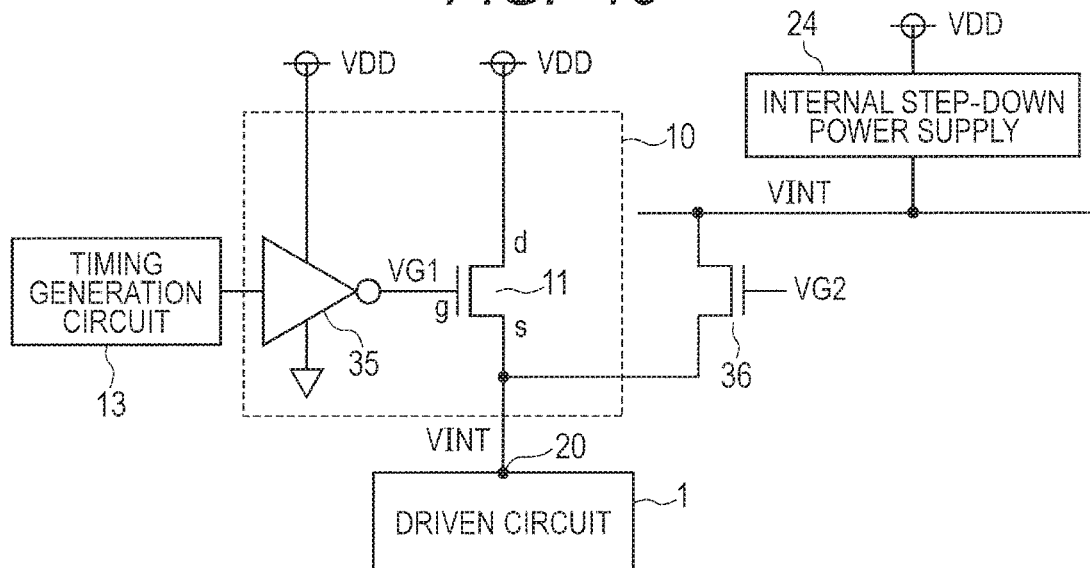
FIG. 19 shows an example of a modified step-down driver circuit.
Figure 20:
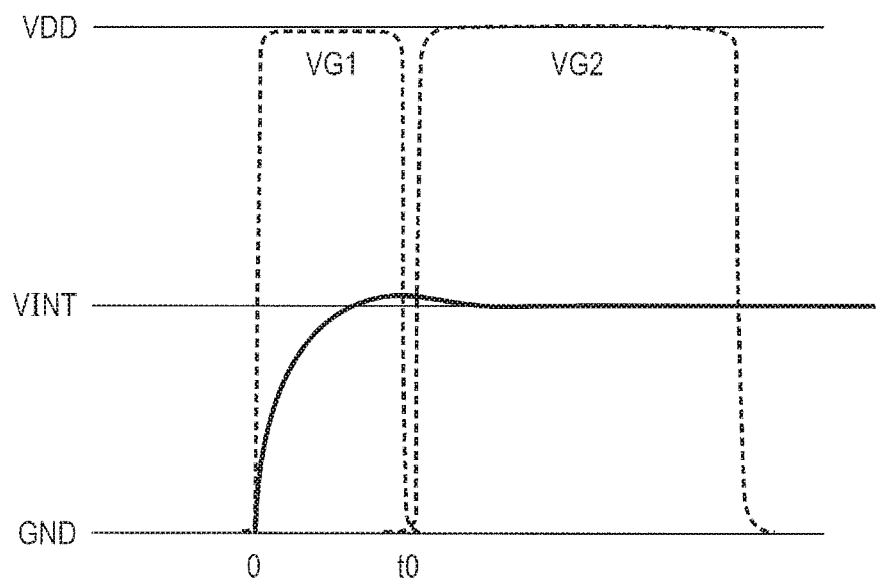
FIG. 20 shows operation waveforms of the circuit shown in FIG. 19.

In still another example of modification in which an internal step-down power supply circuit to generate the internal potential VINT is separately provided as shown in FIG. 6, a switch element (e.g., a MOS transistor) may be arranged between a potential point (stepped-down potential point) to which the internal potential VINT is supplied from the internal step-down power supply circuit and the driven circuit 1. For this modification, an example circuit configuration is shown in FIG. 19 and operation waveforms are shown in FIG. 20. First, a driver circuit 35 supplies the external potential VDD as the gate voltage VG1 of the NMOS transistor and, when the potential of the voltage supply point 20 rises to around the potential VINT (at time t0), the gate voltage VG1 of the NMOS transistor is dropped to the reference potential GND to turn on the switch element 36 provided between the stepped-down potential point VINT and the driven circuit 1. In this way, the voltage applied can be stabilized. In this case, the switch element 36 is configured with an NMOS transistor with the gate voltage VG2 set to VDD. The stepped-down potential point VINT is supplied with the internal stepped-down potential VINT generated at the internal step-down power supply circuit 24. In cases where the driven circuit 1 is a circuit whose load is large when making a transition from an inactive state to an active state while having a small load after entering an active state, the load voltage variation is small after the driven circuit 1 enters an active state and the potential VINT is not required to enable supply of a large current. This makes it possible to greatly reduce noise generation. Also, with noise generation suppressed in this way, noise generation in the driven circuit 1 is very small and other internal circuits to which the stepped-down potential generated by the internal step-down power supply circuit is supplied are not adversely affected.

Even though, in the configuration of the present embodiment, the drain terminal of the NMOS transistor 11 is coupled to an external power supply terminal to which the external voltage VDD is applied, a low-impedance element may be inserted between the drain terminal of the NMOS transistor 11 and the external power supply terminal. The low impedance element may be, for example, a PMOS switch element in a static on state or an ESD element to be coupled to the external power supply terminal. The PMOS switch element is used, for example, to provide a testing function or a power on/off control function or to implement a measure against ESD. The ESD element may be a diffusion layer region of a transistor or diode, or a resistor element inserted as a measure against ESD. Also, since the power supply metal wiring leading from the external power supply terminal to the drain terminal of the NMOS transistor has an impedance, it can be regarded that a low-impedance element is provided.

Second Embodiment

Figure 9:
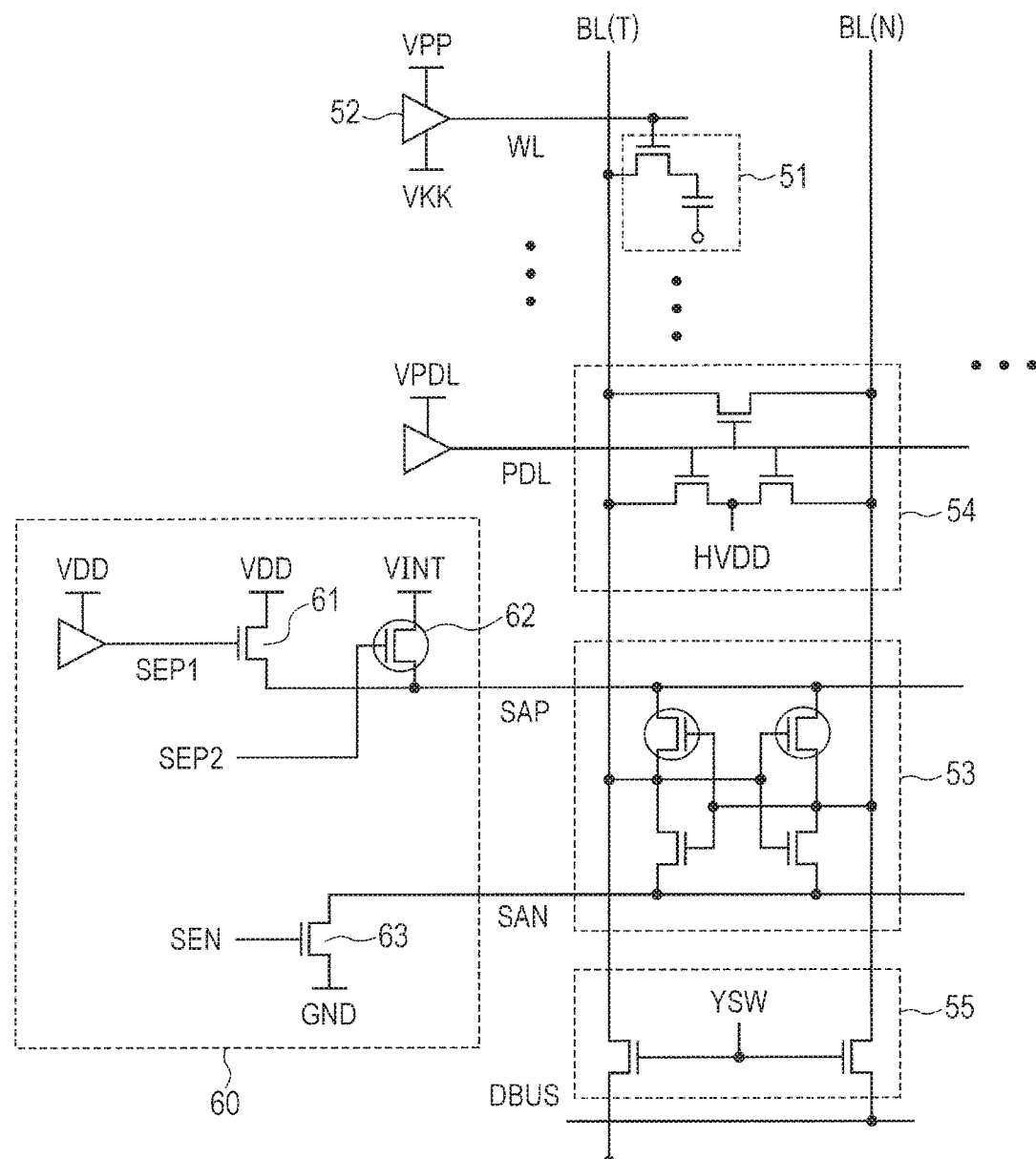
FIG. 9 shows a DRAM circuit configuration.
Figure 10:
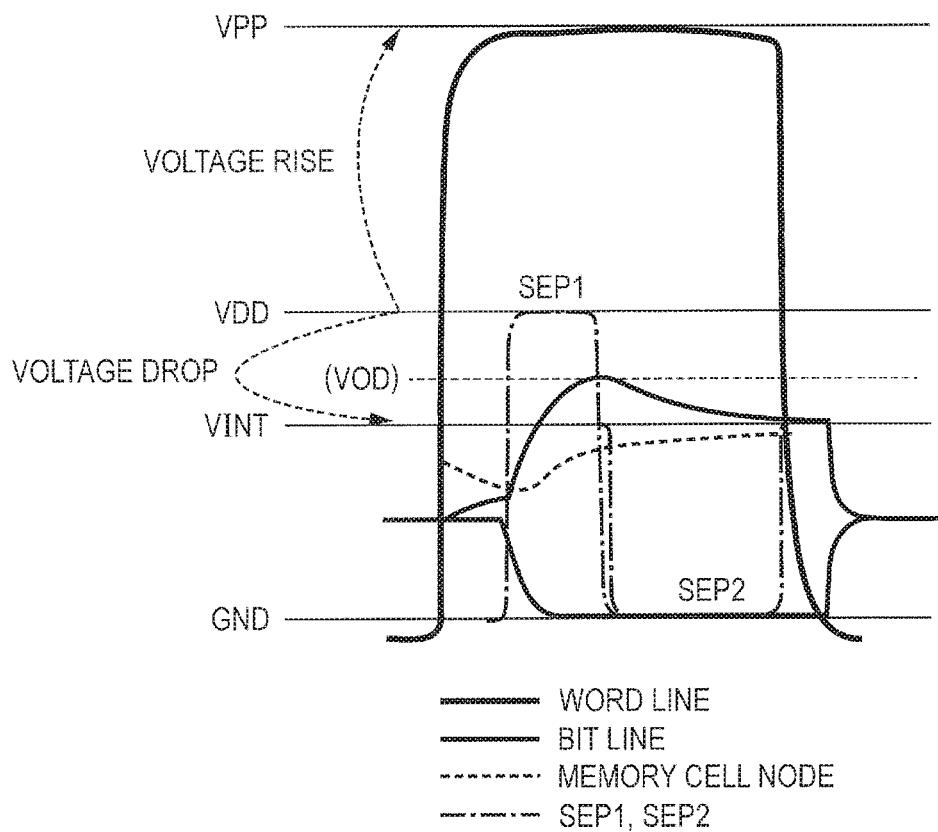
FIG. 10 shows operation waveforms of the sense amplifier driver circuit shown in FIG. 9.

In the following, an embodiment in which a step-down driver circuit is applied to a sense amplifier driver circuit of a DRAM (Dynamic Random Access Memory) will be described. The sense amplifier driver circuit included in a DRAM is a typical circuit for driving a large-load circuit using a step-down power supply. FIG. 9 shows a DRAM circuit configuration and FIG. 10 shows operation waveforms of the sense amplifier driver circuit. The circuit configuration is applicable to both discrete DRAM chips and chips each including both a logic circuit and a DRAM.

A large number of memory cells 51 are respectively coupled to word lines WL and bit lines BL (BL(T) or BL(N)). Each word line driver circuit 52 is supplied with a power supply voltage VPP on the high potential side and a power supply voltage VKK on the low potential side. Each pair of bit lines BL(T) and BL(N) are coupled with a sense amplifier circuit 53. The sense amplifier circuit 53 has a latch configuration including a pair of PMOS and NMOS transistors. A shared source line SAP on the high potential side and a shared source line SAN on the low potential side of the sense amplifier circuit 53 are driven by a sense amplifier driver circuit 60 to be described in detail later. The bit line pair is also coupled with a precharge circuit 54 which, in a precharged state, sets the bit lines BL(T) and BL(N) to a certain voltage HVDD and a column selection switch 55 which couples the bit line voltages appearing in the bit lines BL(T) and BL(N) to a data bus DBUS. The column selection switch 55 is controlled by a column selection signal YSW.

First, the precharge circuit 59 equalizes the potentials of the bit lines BL(T) and BL(N). Subsequently, a word line WL is selected and, when a fine potential difference appears between the pair of bit lines depending on the presence of charges in a capacitor included in the memory 51, the sense amplifier circuit is activated and the potential difference between the bit lines BL(T) and BL(N) is amplified.

As for power supply voltage settings, for example, the external supply power VDD is 1.8 V and the power supply potential VINT for the sense amplifier circuit 53 is 1.0 V obtained by stepping down the external power supply VDD. With the power supply potential for the sense amplifier circuit 53 set low, the overdrive power supply potential VOD for speeding up the operation of the sense amplifier circuit is set to 1.2 V.

The sense amplifier driver circuit 60 is a large load circuit for simultaneously operating hundreds to thousands of sense amplifier circuits 53 as a group. The memory array includes a large number of such circuit groups and some of the circuit groups are activated for use. The sense amplifier driver circuit 60 that has to simultaneously activate a large number of sense amplifier circuits has a heavy load and is, therefore, configured as shown in FIG. 9.

The sense amplifier driver circuit 60 includes an NMOS transistor 61 for driving a shared source line SAP on the high potential side of the sense amplifier circuits, a PMOS transistor 62, an NMOS transistor 63 for driving a shared source line SAN on the low potential side of the sense amplifier circuits, and driver circuits for respectively driving transistors 61 to 63. The NMOS transistor 61 is controlled by a gate signal SEP1 and has a drain coupled to an external power supply terminal which is coupled with an external power supply VDD and a source coupled to the shared source line SAP on the high potential side. The NMOS transistor 61 conducts when the gate signal SEP1 is at high level (VDD) and is turned off when the gate signal SEP1 is at low level (GND). The PMOS transistor 62 is controlled by a gate signal SEP2 and has a source coupled to the internal power supply potential point VINT and a drain coupled to the shared source line SAP on the high potential side. The PMOS transistor 62 conducts when the gate signal SEP2 is at low level (GND) and is turned off when the gate signal SEP2 is at high level (VINT). The NMOS transistor 63 is controlled by a gate signal SEN and has a drain coupled to the shared source line SAN on the low potential side and a source coupled to the reference potential (GND). The NMOS transistor 63 conducts when the gate signal SEN is at high level (VINT) and is turned off when the gate signal SEN is at low level (GND). The internal power supply potential VINT is generated by an internal step-down power supply circuit, not shown, using the external power supply VDD. The word line drive potential VPP is generated by an internal step-up power supply circuit, not shown, using the external power supply VDD.

The circuit operation will be described with reference to the operation waveforms shown in FIG. 10. When the gate signal SEP1 rises to high level (VDD) causing the NMOS transistor 61 to turn on, a current flows in from the external power supply VDD to which the drain terminal is coupled. As a result, the potential of the shared source line on the high potential side rapidly rises. An overdrive assumed potential VOD which is a target voltage-rise value has been set to, for example, 1.2 V. When the high level (VDD) of the gate signal SEP1 is higher than the overdrive assumed potential VOD by a threshold voltage of the NMOS transistor 61, the shared source line on the high potential side is set to the overdrive assumed potential VOD. When the target potential is reached, the gate signal SEP1 is set to low level (GND) causing the NMOS transistor 61 to turn off and the gate signal SEP2 is set to low level (GND) causing the PMOS transistor 62 to turn on so as to return the bit line BL(T) or BL(N) to the potential VINT (=1.0 V).

In the sense amplifier driver circuit 60 shown in FIG. 9, a current is supplied from the external power supply VDD until the potential of the shared source line SAP on the high potential side rises and reaches the overdrive assumed potential VOD. This makes it unnecessary to prepare an internal step-down power supply circuit capable of supplying a large current. The shared source line SAP on the high potential side is subsequently supplied with a current from an internal step-down power supply circuit which generates the internal power supply potential VINT. In this stage, however, only a small portion of the sense amplifier circuits coupled to the sense amplifier driver circuit 60 operate requiring only the current consumption caused by the operation to be supplemented and this does not require any high current supply capability. Namely, while requiring no internal step-down power supply circuit which requires a large current supply, the NMOS transistor 61 is enabled to supply a large drive current. This is effective in speeding up circuit operation and reducing the circuit area.

In recent years, DRAM power supply voltages have been lowered, and there are cases in which external voltage VDD is as low as the internal power supply voltage VINT used in related arts. This tendency is in progress in the field of LSIs with built-in DRAMs by being affected by a trend toward lower logic power supply voltages. In the field of other types of DRAMs, too, a similar trend has been starting to be seen first in the field of faster DRAMs.

Figure 11:
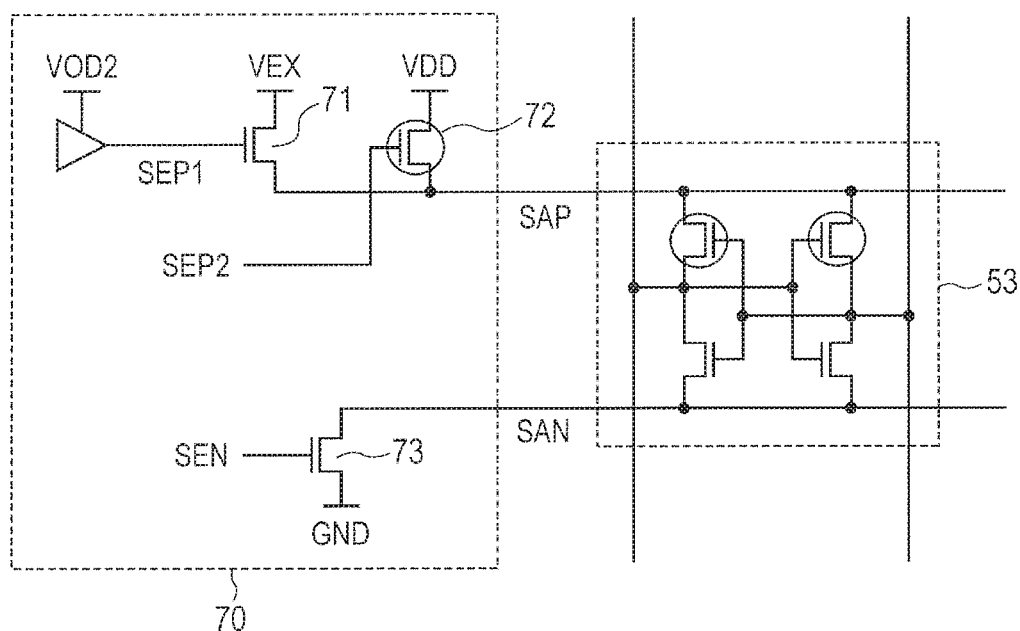
FIG. 11 shows a sense amplifier driver circuit suitable for a low-voltage power supply DRAM.

An example of low-voltage power supply DRAM reflecting the above tendency will be described with reference to FIGS. 11 and 12. A DRAM core basic power supply VDD (=VINT=1.0 V) and an external high-voltage power supply VEX (=VPP=2.5 V) for driving word lines are supplied from outside. Since the memory circuit configuration is similar to that shown in FIG. 9, FIG. 11 shows only the portions directly related with the sense amplifier driver circuit.

A sense amplifier driver circuit 70 includes an NMOS transistor 71 which drives the shared source line SAP on the high potential side of the sense amplifier, a PMOS transistor 72, an NMOS transistor 73 which drives the shared source line SAN on the low potential side, and driver circuits which respectively drive transistors 71 to 73. The NMOS transistor 71 is controlled by the gate signal SEP1 and has a drain coupled to an external power supply VEX and a source coupled to the shared source line SAP on the high potential side. Though not shown, an internal step-down power supply circuit which generates a stepped-down potential VOD2 is provided, and the stepped-down potential VOD2 is supplied as a power supply voltage to a driver circuit to drive the NMOS transistor 71. Therefore, the high level of the gate signal SEP1 is the stepped-down potential VOD2 supplied from the external power supply VEX. Alternatively, an internal step-up power supply circuit which supplies the potential VOD2 generated by stepping up an external power supply VDD may be provided. In the present second embodiment, too, the internal power supply circuit is desirably capable of adjustment to maintain optimum voltage generation regardless of production process variation, temperature variation and external voltage variation. By appropriately adjusting the potential VOD2, bit line voltage BL(T) or BL(N) can be adjusted to be around the target overdrive assumed potential (=1.2 V). For example, the stepped-down potential VOD2 can be made to equal the sum of the overdrive assumed potential VOD and threshold Vth3 of the NMOS transistor 71. Also, the PMOS transistor 72 is controlled by the gate signal SEP2 and has a source coupled to the external power supply VDD and a drain coupled to the shared source line SAP on the high potential side. The PMOS transistor 72 conducts when the gate signal SEP2 is at low level (GND) and is turned off when the gate signal SEP2 is at high level (VDD). The NMOS transistor 73 is controlled by the gate signal SEN and has a drain coupled to the shared source line SAN on the low potential side and a source coupled to the reference potential (GND). The NMOS transistor 73 conducts when the gate signal SEN is at high level (VDD) and is turned off when the gate signal SEN is at low level (GND).

The operation of the sense amplifier driver circuit 70 will be described with reference to operation waveforms shown in FIG. 12. When the gate signal SEP1 rises to high level (VOD2) turning on the NMOS transistor 71, a current comes in from the external high-voltage power supply VEX through the drain terminal coupled thereto causing the potential of the shared source line SAP on the high potential side to rapidly rise. When the potential of the shared source line SAP reaches a target value, the gate signal SEP1 is returned to low level (GND) causing the NMOS transistor 71 to turn off. Subsequently, the gate signal SEP2 is set low (GND), the PMOS transistor 72 is turned on, and the bit line BL(T) or BL(N) is returned to the external potential VDD via the shared source line SAP on the high potential side.

The NMOS transistor 71 of the sense amplifier driver circuit 70 using the external high-voltage power supply VEX for the drain voltage can realize high-speed performance. The sense amplifier driver circuit 70 also uses the external potential VDD, as it is, as the operating voltage of the sense amplifier circuit, so that no internal step-down power supply circuit for generating the internal power supply potential VINT is required. To generate the internal potential VOD2, an internal step-down power supply circuit or an internal step-up power supply circuit is included, but the power supply circuit is required only for driving the gate voltage of the NMOS transistor 71. Therefore, with the load being small, no large current capacity is required, no large area increase is required for the power supply circuit or power supply lines, and no large noise increase is caused.

Figure 12:
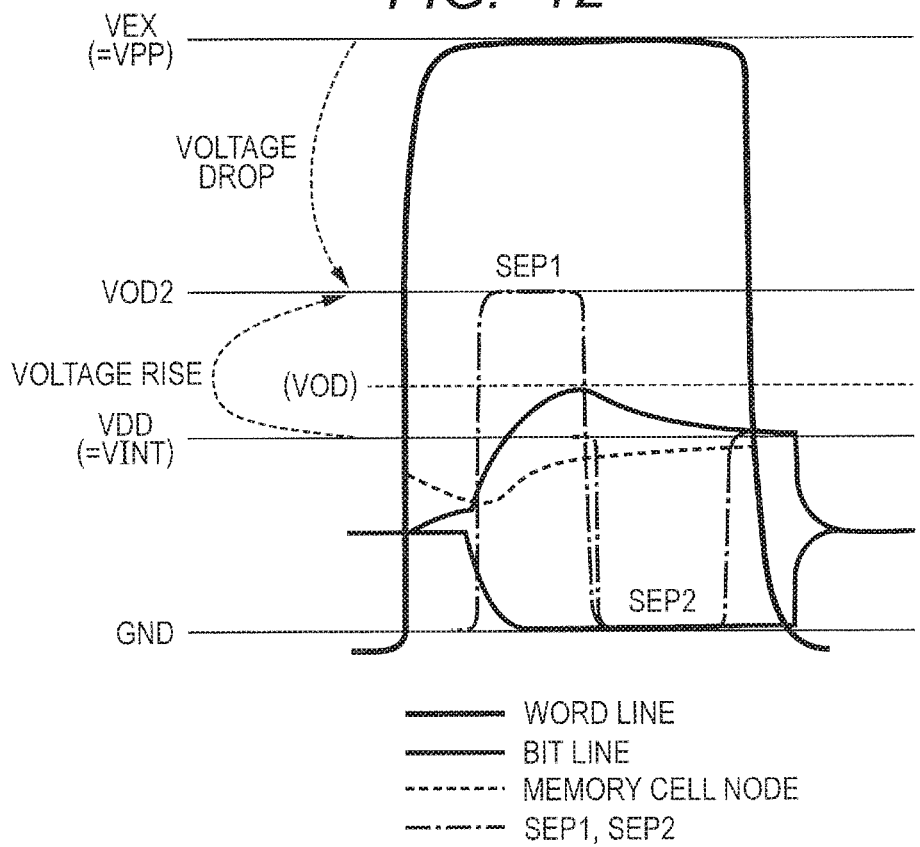
FIG. 12 shows operation waveforms of the sense amplifier driver circuit shown in FIG. 11.

In the example shown in FIG. 12, when the word line drive potential VPP is high or low relative to the external high-voltage power supply potential VEX, the word line drive potential VPP may be generated using an internal step-up power supply circuit or an internal step-down power supply circuit based on the external high-voltage power supply potential VEX.

Another example of a sense amplifier driver circuit to which an external low-voltage power supply can be applied will be described with reference to FIGS. 13 and 14. A sense amplifier driver circuit 80 shown in FIG. 13 includes, as pull-up transistors, an NMOS transistor 81 controlled by the gate signal SEP, a PMOS transistor 82 controlled by the gate signal SEP2 and, in addition, a PMOS transistor 83 which receives the gate signal SEP3. First, the NMOS transistor 81 is turned on when the gate signal SEP1 rises to high level to be the internal potential VOD2. The internal potential VOD2 is generated from the external high-voltage power supply VEX at an internal step-up power supply circuit. Subsequently, the NMOS transistor 81 is turned off by the gate signal SEP1 and the PMOS transistor 83 is turned on by the gate signal SEP3. The source potential of the PMOS transistor 83 is the internal potential VOD that is generated from the external high-voltage power supply VEX at an internal step-down power supply circuit. The gate signal SEP3 keeps the PMOS transistor 83 on for a while so as to maintain an overdrive state of the bit line. Afterwards, the PMOS transistor 83 is turned off by the gate signal SEP3 and also the PMOS transistor 82 is turned on by the gate signal SEP2, returning the bit line BL(T) or BL(N) to the external potential VDD.

By increasing the gate voltage SEP1 of the pull-up NMOS transistor 81, the sense amplifier operation in an initial stage can be made faster and, after a target potential is reached in a short period of time, by keeping the bit line at the overdrive voltage of the internal potential VOD (=1.2 V) for a while, writing of a high potential to a memory cell (target potential=VDD) is made faster. This operation requires three types of pull-up transistors. However, since the NMOS transistor 81 requiring the largest current supply among the three pull-up transistors has high capability, the transistors can be made smaller and this cancels the area increase caused by increasing the number of driver transistors. As a result, almost no area increase occurs for the sense amplifier driver circuit as a whole. Thus, the write and restore characteristics that determine the cycle performance of the DRAM can be made faster involving almost no area increase.

Still another example of a DRAM sense amplifier driver circuit will be described with reference to FIGS. 15 and 16. In the example, a step-down circuit making use of a driver circuit 93 of an NMOS transistor 91 instead of the PMOS transistor 83 shown in FIG. 13 is driven. The driver circuit 93 includes a PMOS transistor 94, a PMOS transistor 95, an operational amplifier 96, and an NMOS transistor 97. When the PMOS transistor 94 is turned on by a timing circuit, not shown, a current flows into the gate terminal of the NMOS transistor 91 from the external high-voltage power supply VEX causing the gate potential SEP1 to be the external potential VEX during an initial period of sensing. This causes the potential of the shared source line SAP on the high potential side to rise. The operation amplifier (differential amplifier circuit) 96, on the other hand, keeps comparing the potential of the shared source line SAP on the high potential side and a reference potential VOD. When the potential of the shared source line SAP on the high potential side reaches the reference potential VOD, the PMOS transistor 94 and the NMOS transistor 97 are turned off and the PMOS transistor 95 is turned on. With the output of the operational amplifier (differential amplifier circuit) fed back to the gate voltage SEP1, the potential of the shared source terminal SAP on the high potential side is maintained at the potential VOD. Afterwards, by turning the NMOS transistor 97 on (leaving the PMOS transistors 94 and 95 off), the NMOS transistor 91 is turned off and the PMOS transistor 92 is turned on by the gate potential SEP2. This returns the bit line BL(T) or BL(N) to the external potential VDD.

Figure 13:
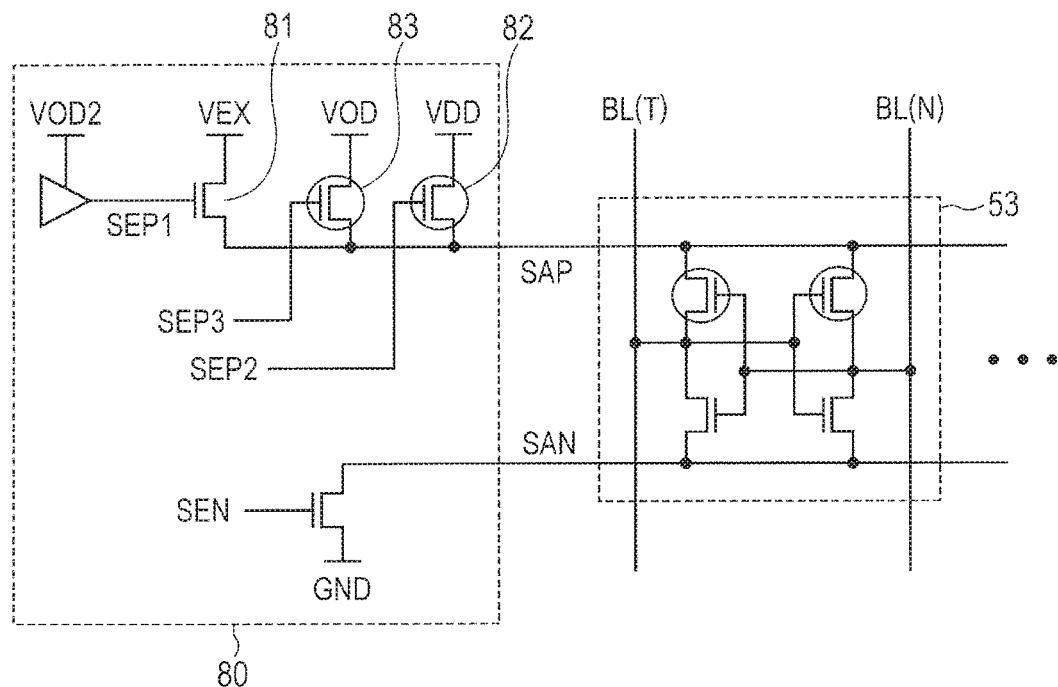
FIG. 13 shows a sense amplifier driver circuit suitable for a low-voltage power supply DRAM.
Figure 14:
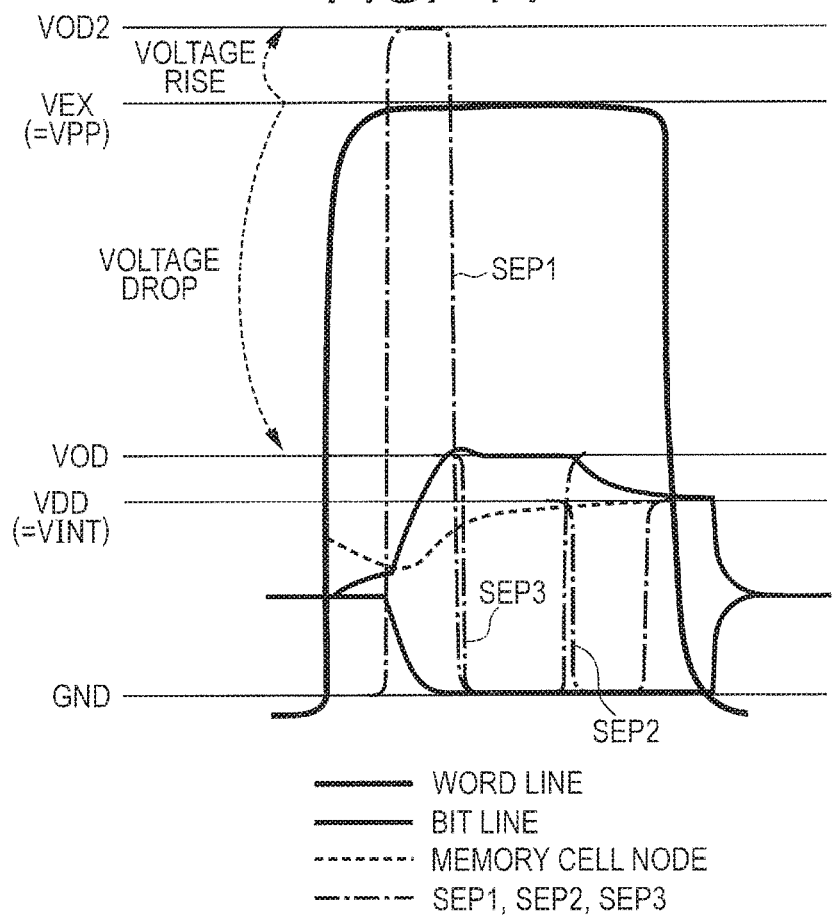
FIG. 14 shows operation waveforms of the sense amplifier driver circuit shown in FIG. 13.
Figure 15:
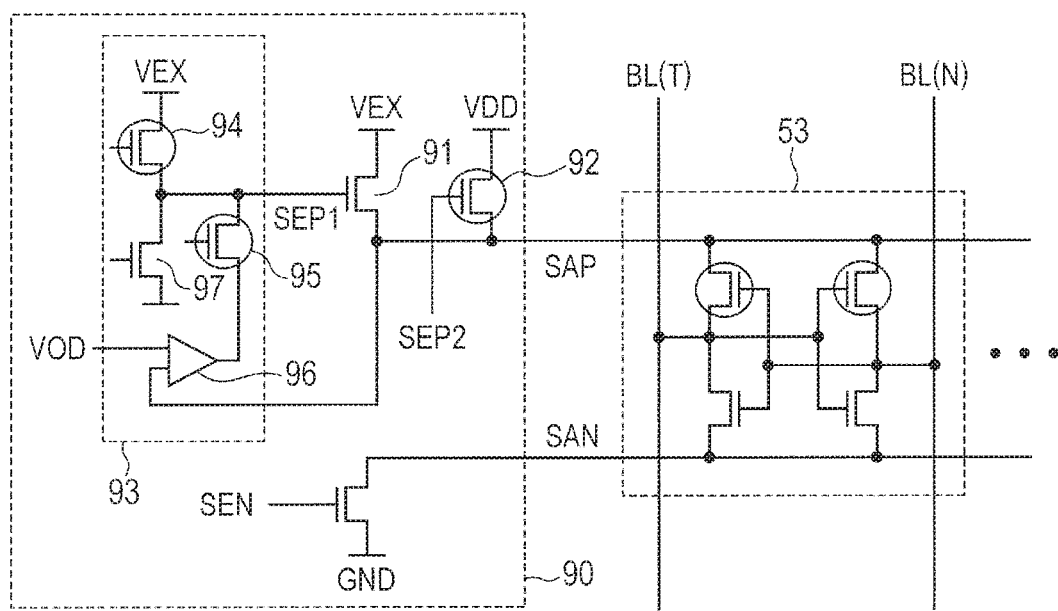
FIG. 15 shows a sense amplifier driver circuit suitable for a low-voltage power supply DRAM.
Figure 16:
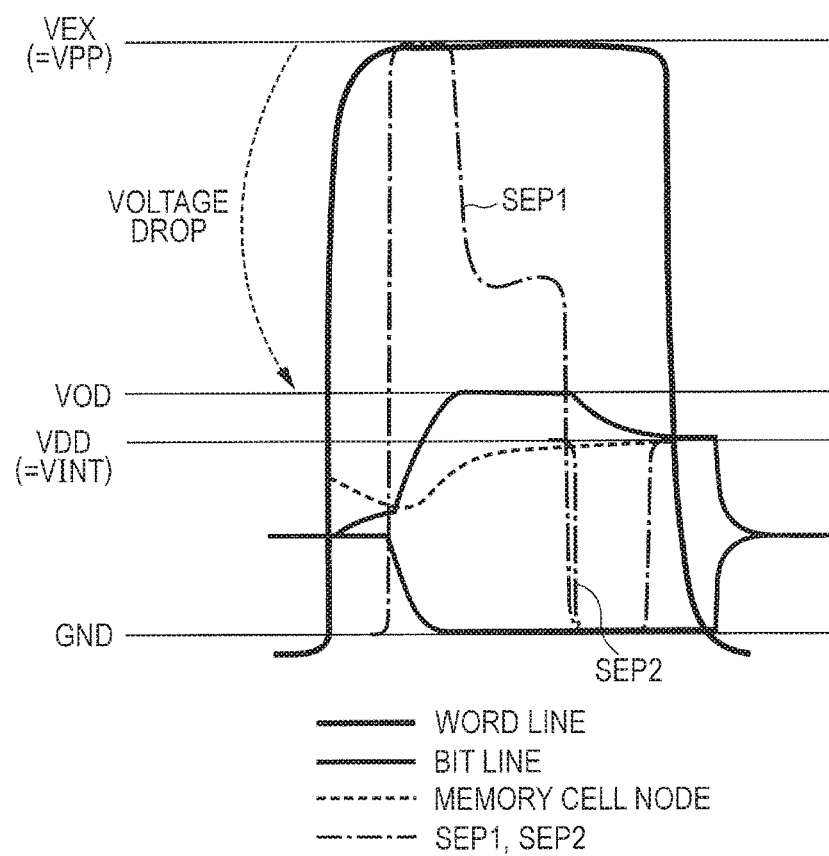
FIG. 16 shows operation waveforms of the sense amplifier driver circuit shown in FIG. 15.

The circuit shown in FIG. 15 includes only two types of pull-up transistors and no current feeding power supply for generating the internal potential VOD as shown in FIG. 13 is required. Instead, the circuit requires an internal power supply circuit for generating the reference potential VOD. Turning such an internal power supply circuit on and making the internal power supply circuit function takes time, but the process can take place during the period in which initial sensing operation is driven by the NMOS transistor 91, so that voltage supply can be started with no delay.

Figure 17:
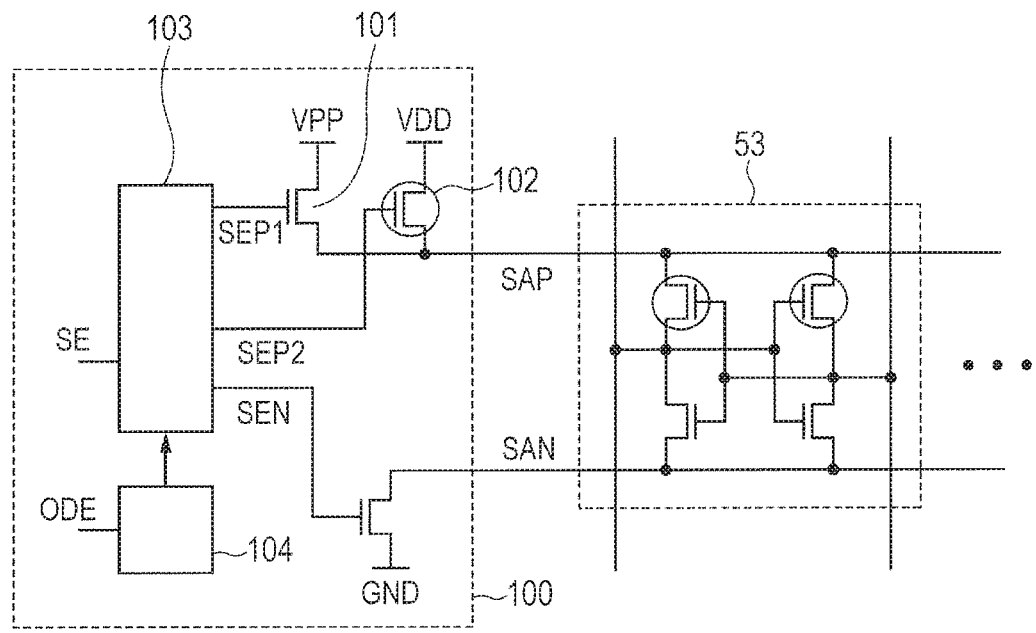
FIG. 17 shows a sense amplifier driver circuit suitable for low power consumption operation.

A sense amplifier driver circuit for greatly improving the DRAM drive current will be described with reference to FIG. 17. Though a sense amplifier driver circuit 100 includes an NMOS transistor 101 for setting the shared source line SAP on the high potential side to the overdrive potential VOD and a PMOS transistor 102 for setting the shared source line SAP on the high potential side to the external potential VDD, in cases where a sense amplifier activation circuit 103 makes overdriving unnecessary, the NMOS transistor 101 is not used for pull-up operation and only the PMOS transistor 102 is made to perform pull-up operation. Since the sense amplifier circuit 53 includes small transistors, it is prone to performance variation. By performing overdriving for slow sense amplifier circuits and not performing overdriving for fast-enough sense amplifier circuits, the power consumed to drive the sense amplifier circuits can be reduced.

Figure 18:
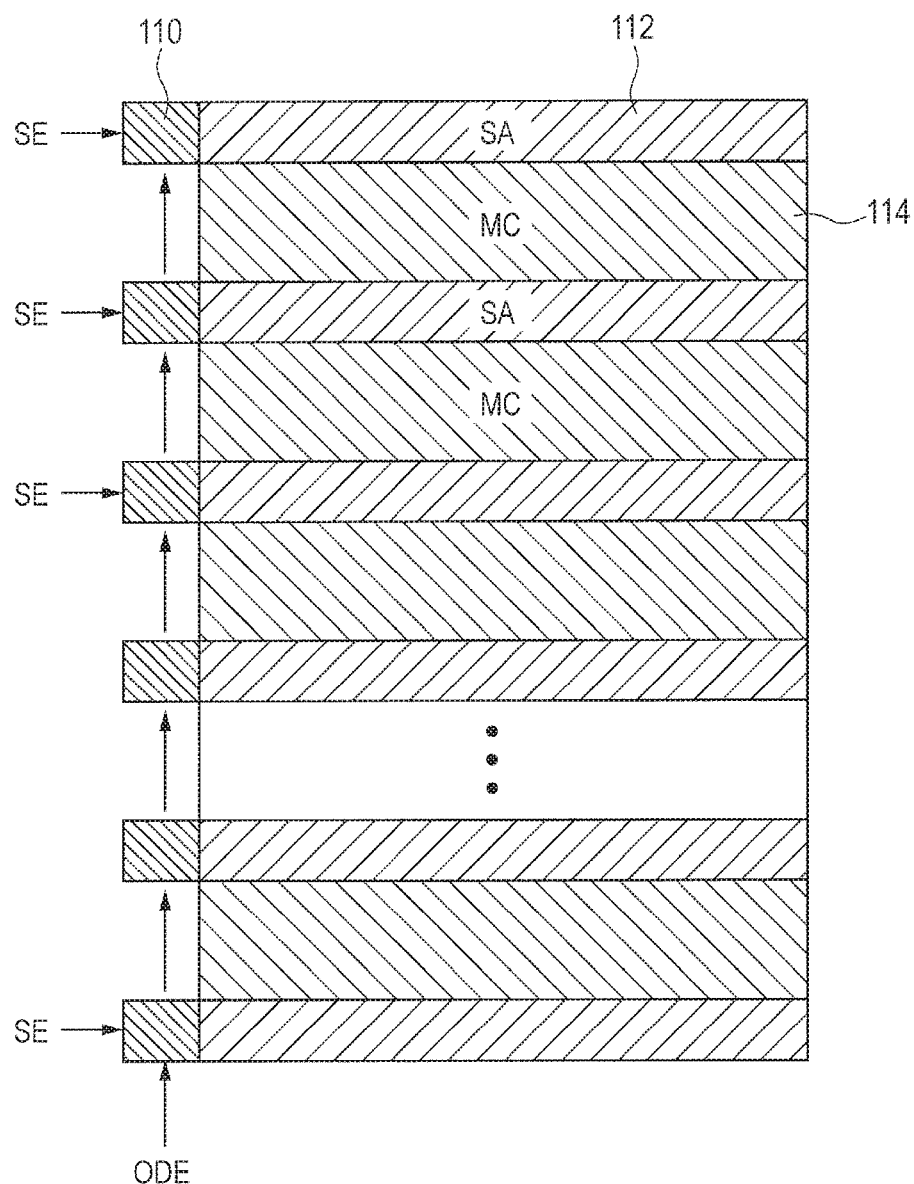
FIG. 18 shows a DRAM memory array layout.

In this case, however, in order to make the PMOS transistor 102 powerful enough to drive the sense amplifier circuits by itself, it is necessary to make the PMOS transistor 102 larger than in the foregoing embodiments. Making the PMOS transistor 102 larger, however, does not result in an overall area increase. This is because internal power supply circuits required for overdriving can be simplified and made smaller compared with those used in cases where related-art circuit configurations are used. Hence, an overall area increase does not result. Whether or not to enable overdriving can be set using an overdrive activation flag ODE of a register 104 and the setting in the register 109 can be switched during a memory production process or in a test process after production. Also, the flag data ODE may be set by a program circuit such as a fuse provided in the memory chip or in a separate chip. FIG. 18 shows a layout of a DRAM memory array. A sense amplifier driver circuit arranged in a region 110 is coupled with many sense amplifier circuits arranged in a region 112. In a region 114, a memory cell array coupled to the sense amplifier circuits are arranged. When all sense amplifier circuits coupled to a sense amplifier driver circuit can operate at a prescribed speed, it is determined that overdriving is not necessary. In this way, a circuit driving system can be arranged such that overdriving is selectively performed only for chips or partial intra-chip areas which require overdrive assistance due to production process variation or intra-chip transistor variation in sense amplifiers. This limits the increase of current consumption by sense amplifier operation, so that the overall current consumption by a product as a whole can be greatly reduced.

Embodiments in which the present invention is applied to sense amplifier circuits for memories have been described, but the invention can also be applied to such large-load driver circuits as word line driver circuits, bit line precharge circuits, column selection circuits and data bus driver circuits or to other types of memory circuits.

The present invention has been concretely described based on embodiments, but the invention is not limited to the above embodiments and can be modified in various ways without departing from the scope of the invention.

What is claimed is:

1. A semiconductor device, comprising:
an external power supply terminal to be coupled to an external power supply;
a plurality of bit line pairs to be coupled with memory cells;
a plurality of sense amplifier circuits with which the bit line pairs are respectively provided;
a shared source line on a high potential side and a shared source line on a low potential side to be coupled with the sense amplifier circuits; and
a sense amplifier driver circuit to supply a potential to the shared source line on the high potential side,
wherein the sense amplifier driver circuit includes an NMOS transistor having a drain coupled to the external power supply terminal and a source coupled to the shared source line on the high potential side and a first PMOS transistor having a source coupled to a first potential point with a first potential lower than the external potential supplied from the external power supply terminal and a drain coupled to the shared source line on the high potential side, and wherein the first potential is a power supply potential of the sense amplifier circuit.

2. The semiconductor device according to claim 1,
wherein, after putting the NMOS transistor in a conducting state causing bit lines on one side of the bit line pairs to reach a second potential higher than the first potential, the sense amplifier driver circuit puts the NMOS transistor in a non-conducting state causing the first PMOS transistor to be put in a conducting state.

3. The semiconductor device according to claim 1, further comprising an internal power supply circuit to generate a second potential lower than the external potential and higher than the first potential,
wherein the sense amplifier driver circuit further includes a second PMOS transistor having a source coupled to a second potential point to which the second potential is supplied from the internal power supply circuit and a drain coupled to the shared source line on the high potential side, and
wherein, after putting the NMOS transistor in a conducting state causing the bit lines on one side of the bit line pairs to reach the second potential, the sense amplifier driver circuit puts the NMOS transistor in a non-conducting state and the second PMOS transistor in a conducting state and then, after elapse of a predetermined period of time, puts the second PMOS transistor in a non-conducting state and the first PMOS transistor in a conducting state.

4. The semiconductor device according to claim 1,
wherein the sense amplifier driver circuit includes a gate driver circuit to drive the gate of the NMOS transistor,
wherein the gate driver circuit includes a third PMOS transistor to supply the external potential to the gate of the NMOS transistor and a fourth PMOS transistor to supply a potential to the gate of the NMOS transistor by feeding back the potential of the shared source line on the high potential side, and
wherein, after putting the third PMOS transistor in a conducting state causing the bit lines on one side of the bit line pairs to reach the second potential higher than the first potential, the gate driver circuit puts the third PMOS transistor in a non-conducting state and the fourth PMOS transistor in a conducting state.

5. The semiconductor device according to claim 4, further comprising an internal power supply circuit to generate the second potential,
wherein the gate driver circuit supplies an output potential of a differential amplifier circuit to which the potential of the shared source line on the high potential side and the second potential supplied from the internal power supply circuit are inputted to the gate of the NMOS transistor via a source-drain path of the fourth PMOS transistor.

6. The semiconductor device according to claim 5,
wherein, when a predetermined period of time elapses after the fourth PMOS transistor included in the gate driver circuit is put in a conducting state, the fourth PMOS transistor is put in a non-conducting state and the first PMOS transistor is put in a conducting state.

7. The semiconductor device according to claim 1, further comprising a sense amplifier activation circuit,
wherein, when an overdrive activation flag is in a first state, the sense amplifier activation circuit puts, after the sense amplifier driver circuit puts the NMOS transistor in a conducting state causing the bit lines on one side of the bit line pairs to reach the second potential higher than the first potential, the NMOS transistor in a non-conducting state causing the first PMOS transistor to be put in a conducting state and, when the overdrive activation flag is in a second state, the sense amplifier driver circuit puts the first PMOS transistor in a conducting state without putting the NMOS transistor in a conducting state.

8. The semiconductor device according to claim 7, wherein the overdrive activation flag is set during a semiconductor device production process or in a testing process after production.

* * * * *